United States Patent [19]

Thompson

[11] Patent Number: 4,527,079
[45] Date of Patent: Jul. 2, 1985

[54] INTEGRATED CIRCUIT DEVICE ACCEPTING INPUTS AND PROVIDING OUTPUTS AT THE LEVELS OF DIFFERENT LOGIC FAMILIES

[75] Inventor: Michael D. Thompson, Los Gatos, Calif.

[73] Assignee: Advanced Micro Devices, Inc., Sunnyvale, Calif.

[21] Appl. No.: 547,819

[22] Filed: Nov. 1, 1983

[51] Int. Cl.³ .................... H03K 19/092; H03K 19/01
[52] U.S. Cl. .................................. 307/475; 307/443; 307/446
[58] Field of Search ................ 307/443, 446, 455–458, 307/475; 365/63, 72, 189

[56] References Cited

U.S. PATENT DOCUMENTS

| | | | |
|---|---|---|---|
| 3,959,666 | 5/1976 | Fett et al. | 307/475 |
| 3,974,402 | 8/1976 | Fett et al. | 307/475 |
| 3,986,045 | 10/1976 | Lutz | 307/475 |
| 4,135,103 | 1/1979 | Fulkerson | 307/475 |
| 4,368,395 | 1/1983 | Taylor | 307/475 X |
| 4,472,647 | 9/1984 | Allgood et al. | 307/475 |
| 4,477,740 | 10/1984 | Takeda | 307/475 X |

FOREIGN PATENT DOCUMENTS 0023118  1/1981  European Pat. Off. ............ 307/475

OTHER PUBLICATIONS

Armstrong, "TTL Interfacing with GRL111 and GRL101"; Electron. Appl. (Netherlands), vol. 30, No. 4, 1970, pp. 145-154.

Primary Examiner—Larry N. Anagnos
Attorney, Agent, or Firm—Patrick T. King; J. Vincent Tortolano

[57] ABSTRACT

An integrated circuit device containing internal logic and/or memory circuitry is provided with means to receive multiple inputs at the voltage levels of different logic families and with means to provide multiple outputs at the voltage levels of different logic families. On-chip input translators receive the inputs at the level of a given logic family and translate to the level required by the internal logic and/or memory circuitry. After performance of logic and/or memory functions, on-chip output translators translate the output of the internal logic and/or memory circuitry and provide external outputs at the voltage levels of different logic families. The internal logic and/or memory circuitry may be of a single logic family or may be composed of several logic families. On-chip translators may also be added between internal logic and/or memory circuitry of different families.

12 Claims, 5 Drawing Figures

INTEGRATED CIRCUIT DEVICE ACCEPTING INPUTS AND PROVIDING OUTPUTS AT THE LEVELS OF DIFFERENT LOGIC FAMILIES

BACKGROUND OF THE INVENTION

Field of the Invention

This invention relates to an integrated circuit device incorporating internal logic and/or memory circuitry and, more particularly, relates to an integrated circuit device which can accept inputs at the levels of different logic families and which can provide outputs at the levels of different logic families.

In the development of semiconductor devices, separate logic families have developed. Using bipolar processes, the following logic families have developed: transistor-transistor logic (TTL), integrated injection logic ($I^2L$) and emitter-coupled logic (ECL). Using metal oxide semiconductor fabrication processes, both MOS and CMOS logic families have developed. Each logic family has its own circuit building blocks and operating parameters including set reference voltage levels and specified ranges of voltages, the so-called "levels", which signify the digital information, e.g. whether a digital "1" or a digital "0" is to be signified by the state of the device. The conventional approach has been to design an integrated circuit using a particular logic family to carry out logic or memory functions. Thus, a CMOS circuit would have signals supplied to it which were suitable to match the internal signals within the device; the output would also have a CMOS format. Similarly, an ECL circuit would have input voltages within the ranges which would specify uniquely the information being provided; the output would also be supplied in an ECL format.

Transistor-transistor logic was one of the earliest logic families and has been widely adopted for integrated circuit design. It remains a very pervasive logic family. As a consequence, in order to obtain compatability with TTL circuits some circuits designed with logic families other than TTL are provided input translators and with output translators which make the circuits look like TTL circuits. For example, some CMOS circuits are made to appear as TTL circuits. Also, so-called pseudo-ECL devices have internal ECL circuitry yet look externally like TTL devices. The AMD 29116 Microprocessor and the AMD 29501 Programmable Signal Processor are pseudo-ECL devices. Such devices are effectively high performance TTL devices and do not allow different logic circuit families to be used together on the same circuit board.

As the level of integration and degree of sophistication of semiconductor devices has increased, circuit designers have selected their circuit building blocks from parts based on different logic families. This has been due to the availability of complex logic functions and/or dense memory arrays in all of these various logic families. As a consequence, it has been necessary to provide external translators which would translate, for example, the output of a TTL chip to an ECL voltage level so that an associated ECL chip would receive an input that it could recognize. The Signetics 10124 TTL to ECL translator is such a part. Conversely, the output of an ECL chip may have required translation to a TTL logic level for an input to a TTL chip.

Emitter-coupled logic (ECL) gates are widely utilized for high-speed data processing, digital communication and test equipment. ECL offers high speed-power products and has the shortest propagation delay of any logic form. As a consequence, many high performance circuits are being designed with internal ECL logic. This internal logic may be required to receive inputs from or provide outputs to, for example, MOS or TTL devices. Or, an ECL chip may receive inputs from or provide outputs to an $I^2L$ based logic device. Rather than use external translators which waste power and which add delays which work against the inherent short propagation delays of the ECL logic, it is greatly desired that on-chip translation capabilities be provided. The need for translation is due to the unique logic levels for each family. In the ECL logic scheme a voltage more positive than $-0.8$ volt is considered to be a logic "1", while a voltage more negative than $-1.6$ volts is considered to be a logic "0". In the TTL logic family a voltage greater than $+2$ volts is considered to be a logic "1" while a voltage less than $+0.8$ volts is considered to be a logic "0". Within integrated injection logic devices, a logic "1" is specified as a voltage greater than $V_{BE}$ and a logic "0" is specified as a voltage less than $V_{SAT}$. For CMOS a digital "1" is $V_{CC}$ and a digital "0" is ground. For any given application there may be a preference for performing logic or storing memory using one particular logic family. Or there may be a need to mix several logic families on one chip. In either case multiple on-chip translators would be desirable to permit mixing and matching. Since there is a preference for obtaining high performance by utilizing internal logic functions with ECL logic, the on-chip translation scheme of the present invention will be described in the context of an integrated circuit device having ECL internal logic which receives inputs in several logic families.

BRIEF DESCRIPTION OF THE DRAWINGS

For a more complete understanding of the integrated circuit device of the present invention, reference may be had to the accompanying drawings which are incorporated herein by reference and in which.

SUMMARY OF THE INVENTION

An integrated circuit device containing internal logic and/or memory circuitry is provided with means to receive multiple inputs at the voltage levels of different logic families and with means to provide multiple outputs at the voltage levels of different logic families. On-chip input translators receive the inputs at the level of a given logic family and translate to the level required by the internal logic and/or memory circuitry. After performance of logic and/or memory functions, on-chip output translators accept the output of the internal logic and/or memory circuitry and provide external outputs at the voltage levels of the different logic families. No translation is required for inputs or outputs at levels of the logic family of the internal logic and/or memory circuitry. The internal logic and/or memory circuitry is preferably of a single logic family or may be composed of several logic families. On-chip translators may also be added between internal logic and/or memory circuitry of different logic families. Output buffers are preferably included in the output translators.

DESCRIPTION OF THE PREFERRED EMBODIMENTS

As circuit designers pick and choose from available logic and memory devices, they are increasingly mixing devices of different logic families. Thus, on a printed circuit board an ECL circuit may be placed adjacent a TTL circuit or an I²L circuit. As a consequence, there is required a translation of voltage levels from family to family. External translators such as the Signetics 10124 TTL to ECL translator are available and are used to implement overall circuit function. Since these translators introduce time delays which degrade overall circuit performance, their use is becoming less tolerable as the performance of individual devices, such as high performance ECL, is enhanced. The present invention is predicated upon providing translators on-chip to accept inputs at a given logic level, translate them to the logic level required for internal logic or memory operations and then translate the outputs for delivery external to the chip. These on-chip translators are intended to allow multiple inputs of different logic families and provide multiple outputs of different logic families rather than merely make a device look like a device of another logic family as with pseudo-ECL, described above.

Figure 1:
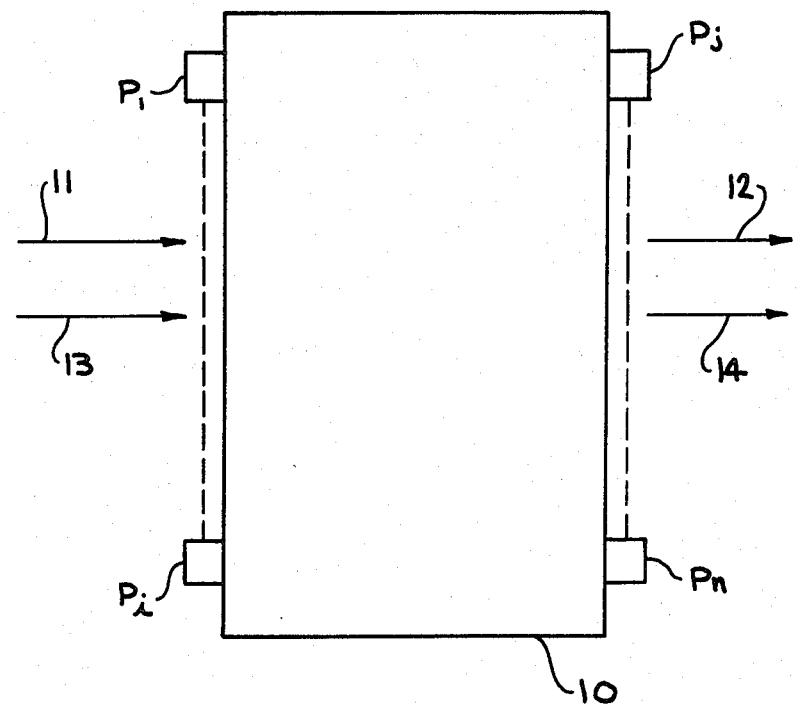
FIG. 1 is a symbolic diagram of an integrated circuit chip having multiple inputs and multiple outputs.

The significance of the on-board translator scheme of the present invention may be seen with reference to FIG. 1. Integrated circuit device 10 has multiple pins $P_1 \ldots P_i, P_j \ldots P_n$. The pins are dedicated for such purposes as inputs, outputs, power supplies and clocking. For a typical integrated circuit device having sixty-four pins, it would be common for five pins to be dedicated to power supplies, twenty-five pins for input lines and thirty-four pins for output lines. With integrated circuit devices of the prior art, each of the twenty-five input pins would only be able to accept inputs, e.g., inputs on lines 11 or 13, at a specified voltage level associated with the particular logic family of the chip or specified to be accepted by the chip such as with pseudo-ECL. Similarly, output signals, e.g., signals 12 or 14, would have been provided on each of the thirty-four output pins at the voltage level associated with the particular logic family of the chip or specified to be accepted by the chip. With the present invention, whatever the logic family of the internal logic and/or memory units, the inputs may be provided at a voltage level associated with any logic family desired, provided that within the chip there has been provided a translator to translate the voltages as received to the voltage levels of the logic and/or memory circuitry within the chip. Also, the outputs provided on the thirty-four output lines may be provided at voltage levels associated with any logic family desired, provided on-chip translators are available to translate from the level of the internal logic and/or memory circuitry to the output levels. The integrated circuit device of the present invention is highly versatile in that it permits the most suitable logic family to be selected for internal logic and/or memory operations yet allows the device to be mixed and matched with devices based on various logic families.

Since the ECL logic family has the highest speed-power product and is a preferred logic family for the performance of internal logic, the present invention will be described primarily in the context of an integrated circuit device having internal ECL logic, ECL and TTL inputs and ECL and TTL outputs. The integrated circuit device 10, shown in FIG. 2, therefore has an internal logic section 19 incorporating ECL logic. Logic inputs at a TTL level are received on line 11 at input pin $P_{11}$. Inside the chip the TTL level voltages are translated in TTL to ECL translator 15, a preferred embodiment of which is described subsequently and shown in FIG. 3. The ECL version of the TTL input is introduced to ECL internal logic 19 whereupon logical operations are performed. Logic inputs at an ECL level are supplied on line 13 to input pin $P_{13}$. The ECL level signals are accepted by the integrated circuit device 10 through ECL input port 17 which may be a conductive connection or may contain a resistor or buffer to insulate the ECL internal logic 19 from external noise or transients. The output of the ECL input port 17 is supplied directly to ECL internal logic 19 whereupon where logic operations are performed. The output of ECL internal logic 19 is provided at ECL levels to both ECL output port 16 and the ECL to TTL translator 18. ECL output port 16 will always contain a buffer since it must drive at least a 50 ohm load and therefore must provide significant current. The ECL output is provided on dedicated output pin $P_{12}$ and thence to output line 12. ECL to TTL translator 18 is shown in a preferred embodiment in FIG. 4 and described subsequently. The TTL output of ECL to TTL translator 18 is supplied to output pin $P_{14}$ and thence to output line 14. As a consequence of the circuit arrangement within integrated circuit 10, the ECL internal logic has been able to receive inputs at two logic levels and to provide outputs at the same two logic levels, thus allowing mixing and matching with devices of other circuit families.

Figure 3:
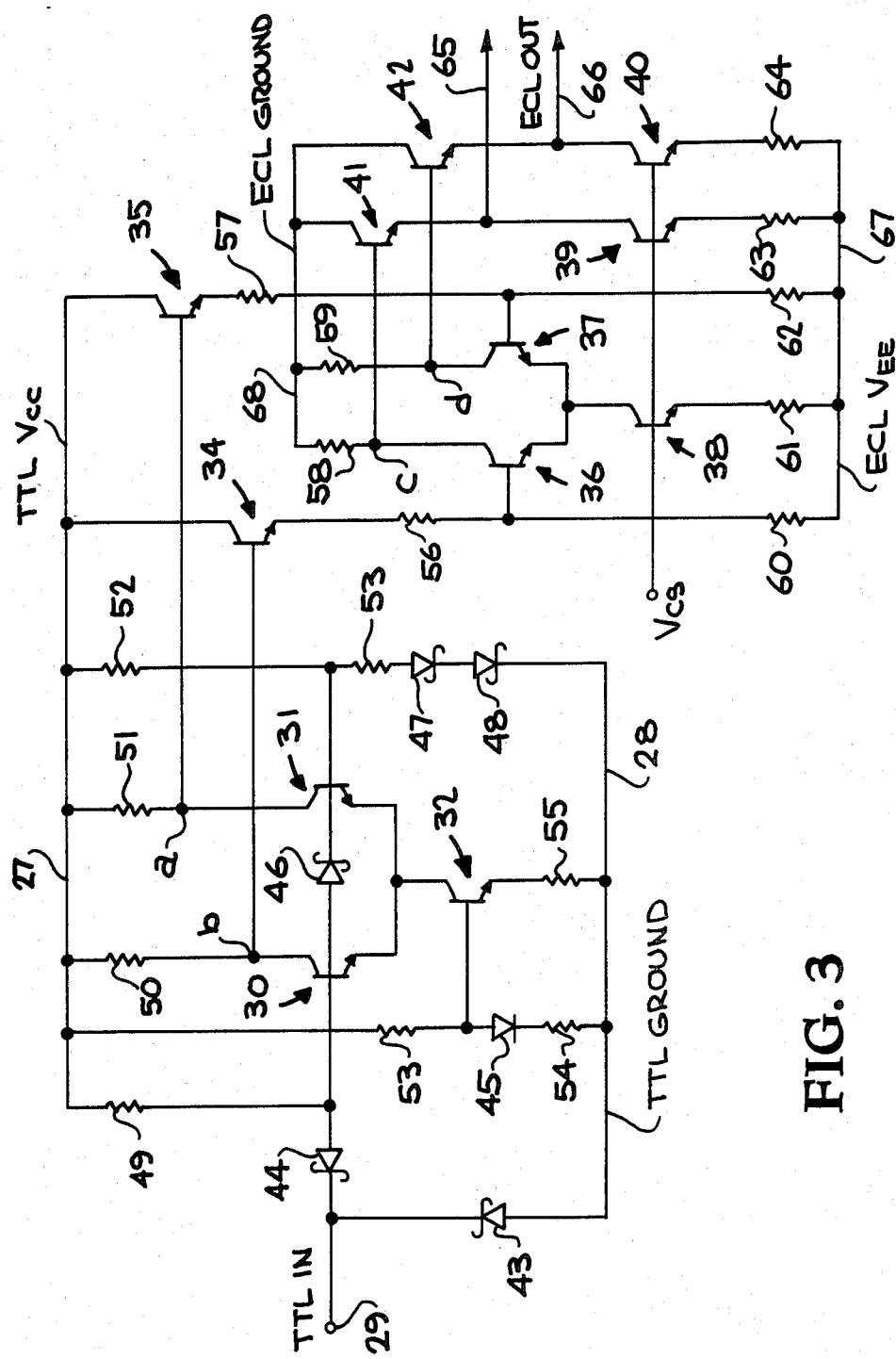
FIG. 3 is a circuit schematic of a TTL to ECL translation circuit incorporated in one embodiment of the integrated circuit device of FIG. 2.

The shifting of a TTL level to an ECL level is accomplished by the circuit shown in FIG. 3. This is a preferred circuit embodiment; many circuit schemes could accomplish similar results. The differential drive within the circuit of FIG. 3 allows a small voltage to change the logic swing on the output, i.e., the circuit will respond quickly to changes in logic levels since only about 0.4 volt is required to produce a swing. Since logical swings in logic circuits occur at about 1 volt per nanosecond, the lesser the voltage to produce a recognizable change in logic state, the faster the swing. This explains the low propagation delay of ECL logic since a voltage swing of only 0.2 to 0.4 volt reaches the threshold of a change in logic state whereas with TTL a voltage swing of 1.2 to 1.5 volts is required. With the translator of FIG. 3 the fast response preserves the performance of the overall integrated circuit device, i.e. the performance of ECL internal logic is not degraded. The operation of the circuit of FIG. 3 will be described for both a TTL input signifying a logic 1 and a TTL input signifying a logic 0.

TTL Input of 3 Volts-Logic 1

With a TTL input of 3 volts impressed on terminal 29 the Schottky diode 44 is reversed biased and shut off. Current then flows through resistor 49 into the base of transistor 30 which is thereby turned on. The base of transistor 31 is at a fixed potential due to the voltage drops between $V_{CC}$ line 27 and TTL ground line 28 across resistors 52 and 53 and across Schottky diodes 47 and 48. Thus, since the emitters of transistors 30 and 31 are connected, the turning on of transistor 30 will provide a sharp turnoff of transistor 31. The current through transistor 30 will be supplied by constant current source 32 which supplies a current determined by the values of resistors 55 and 54, the characteristics of diode 45 and the value of resistor 53. Since transistor 30 is turned on and transistor 31 is turned off, all current from transistor 32 flows through transistor 30. The current through transistor 30 also passes through resistor 50 producing a potential on node b between TTL $V_{CC}$ and TTL ground. Since transistor 31 is off, there is no voltage drop across resistor 51 so that node a is at the potential of TTL $V_{CC}$. Consequently, the voltage on the base of transistor 35 will be greater than the voltage on the base of transistor 34. Thus, the current through transistor 35, resistor 57 and resistor 62 will be initially greater than the current through transistor 34, resistor 56 and resistor 60. In the most preferred embodiment, the values of resistors 56 and 57 are equal and the values of resistors 60 and 62 are equal to thereby provide potentials on the bases of transistors 36 and 37 which track the current flows through transistors 34 and 36. Consequently, the voltage on the base of transistor 37 is at a higher potential than the voltage on the base of transistor 36. In well-known circuit fashion, since the emitters of transistors 36 and 37 are tied together, transistor 37 turns full on and transistor 36 turns off. The current through transistor 37 is supplied through constant current source 38 and resistor 61. Since transistor 36 is off and transistor 37 is on, there is no current through resistor 58 but there is a current through resistor 59. Thus, node c is at ECL ground level potential while node d is at a negative level between ECL ground and ECL reference voltage $V_{EE}$ ($-5.2$ volts). Consequently, the base of transistor 42 is at a more negative potential than the base of transistor 41. Thus, while currents are flowing through both the parallel legs comprising transistor 41, transistor 39 and resistor 63 and comprising transistor 42, transistor 40 and resistor 64, the current through transistor 41 will be greater than the current through transistor 42. Thus, the potential on the emitter of transistor 41 will be higher than the potential on the emitter of transistor 42 so that the non-inverting output line 65 will have a higher potential than the inverting output line 66. Together, ECL output line 65 and 66 provide the typical complementary logic levels associated with ECL logic. The function of constant current sources consisting of transistor 39 and resistor 63 and of transistor 40 and resistor 64 are to provide a constant base-to-emitter voltage across output transistors 41 and 42. The constant current sources 39, 63 and 40, 64 are controlled by stable bandgap reference voltage $V_{CS}$ typically available on ECL chips. See, e.g., A. H. Seidman, *Integrated Circuits Applications Handbook*, pp. 498-499 (b 1983).

TTL Input of 0.3 Volts-Logic 0

When a voltage of less than 3 volts is impressed on TTL input terminal 29, Schottky diode 44 will experience a voltage drop of about 0.4 volts. Since the base of transistor 31 is at a fixed potential, as described previously, transistor 31 will turn on hard and transistor 30 will turn off due to the low potential impressed upon its base. There will now be experienced a current flow through resistor 51 with no current being passed through resistor 50. Thus, node b will be at the level of TTL $V_{CC}$ whereas node a will be at a lower level. Thus, the voltage on the base of transistor 35 will be lower than the voltage on the base of transistor 34. The lower current through the transistor 34 will produce a higher voltage on the base of transistor 36 than is produced by the current through transistor 35 on the base of transistor 37. Transistor 36 will become conductive thereby turning transisor 37 off due to the coupled emitters. The current through constant current source 38 and resistor 61 will flow through transistor 36 and resistor 58 between ECL $V_{EE}$ line 67 and ECL ground line 68. Consequently, the voltage on node c will be at a more negative potential than the potential on node d which is at the ECL ground level. Thus, the voltage on the base of transistor 42 is greater than the voltage on the base of transistor 41. Consequently, the current through transistor 42 is greater than the current through transistor 41 and the level of inverting ECL output line 66 is greater than the level of non-inverting ECL output line 65. The magnitude of the voltage levels is in accordance with TTL and ECL conventions, described above, and is determined by selecting values for resistors and specifying characteristics of transistors and diodes.

Figure 2:
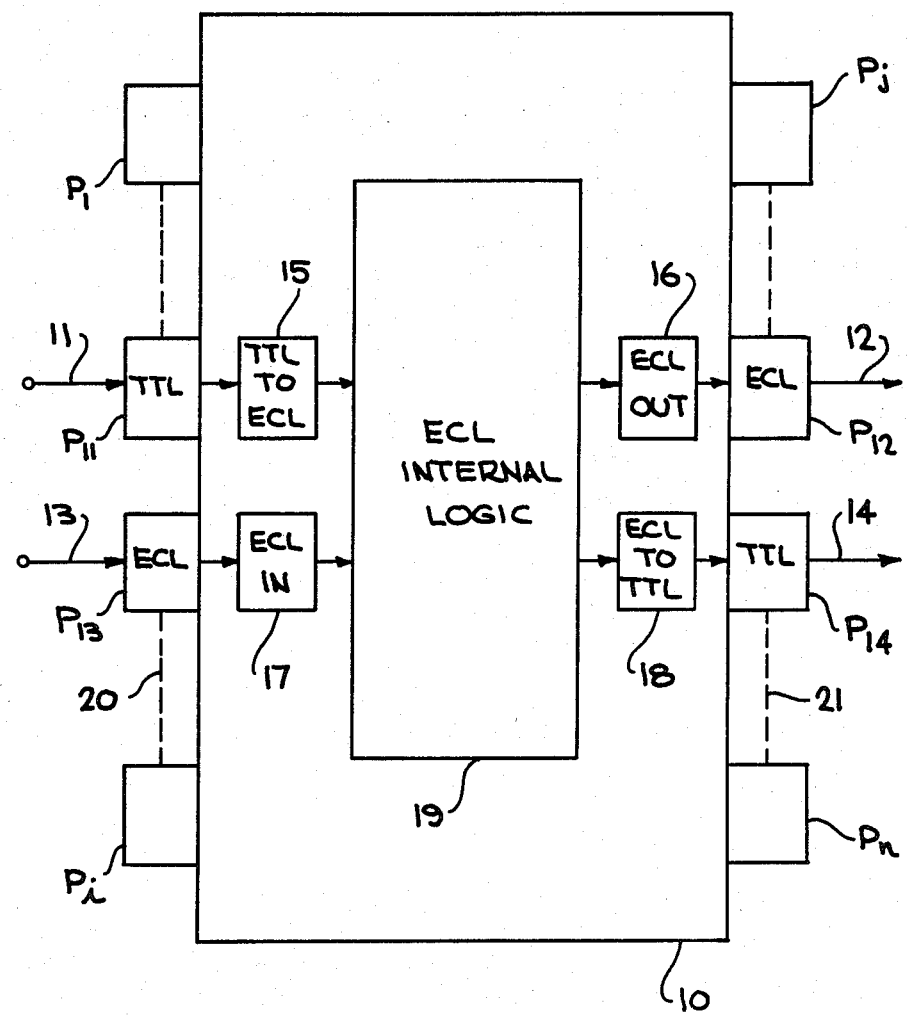
FIG. 2 is a block diagram of the integrated circuit device of the present invention.
Figure 5:
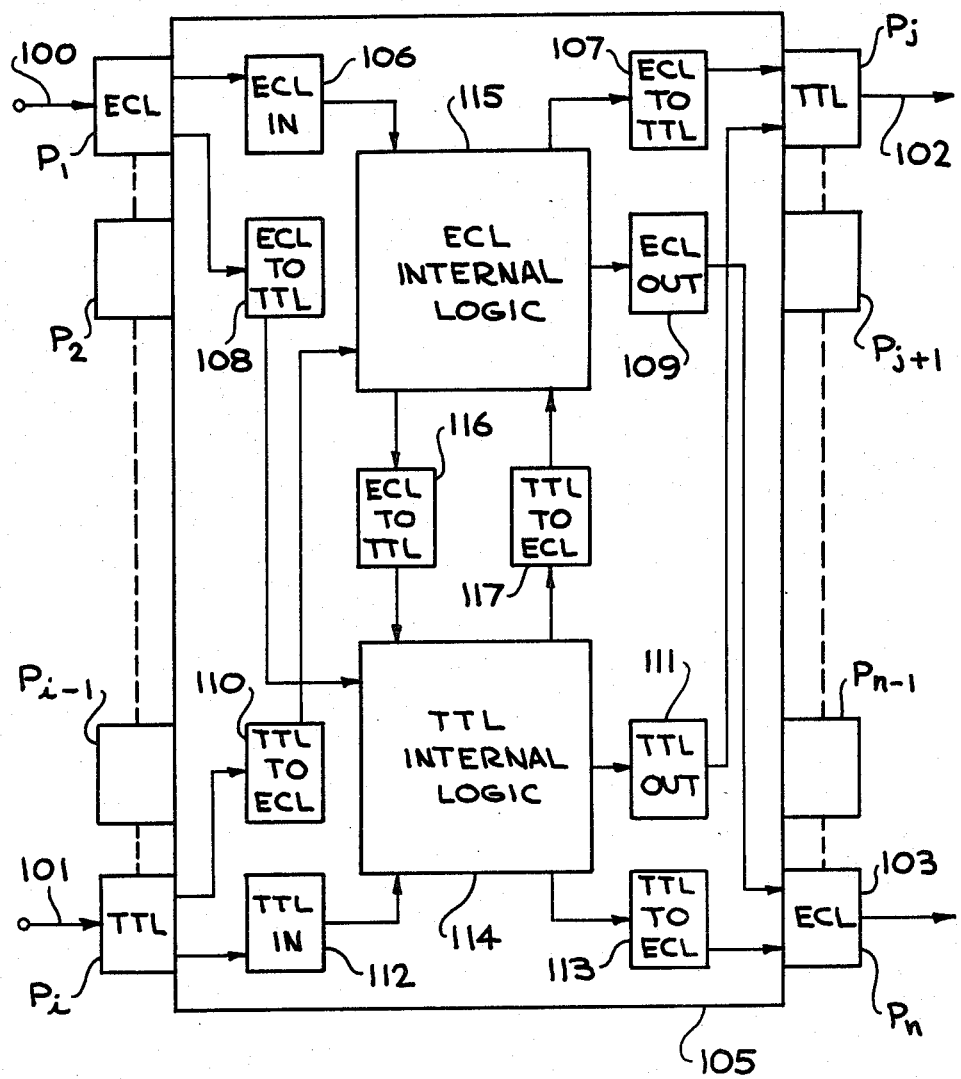
FIG. 5 is a block diagram of another embodiment of the integrated circuit device of the present invention.

The description of the preceding paragraphs has been of a TTL to ECL logic translator suitable for use in block 15 of FIG. 2 or in blocks 110, 113 and 117 of FIG. 5. The outputs available on lines 65 and 66 are non-inverting and inverting logic levels, respectively, and will be at a level suitable for use with ECL internal logic circuit 19.

Figure 4:
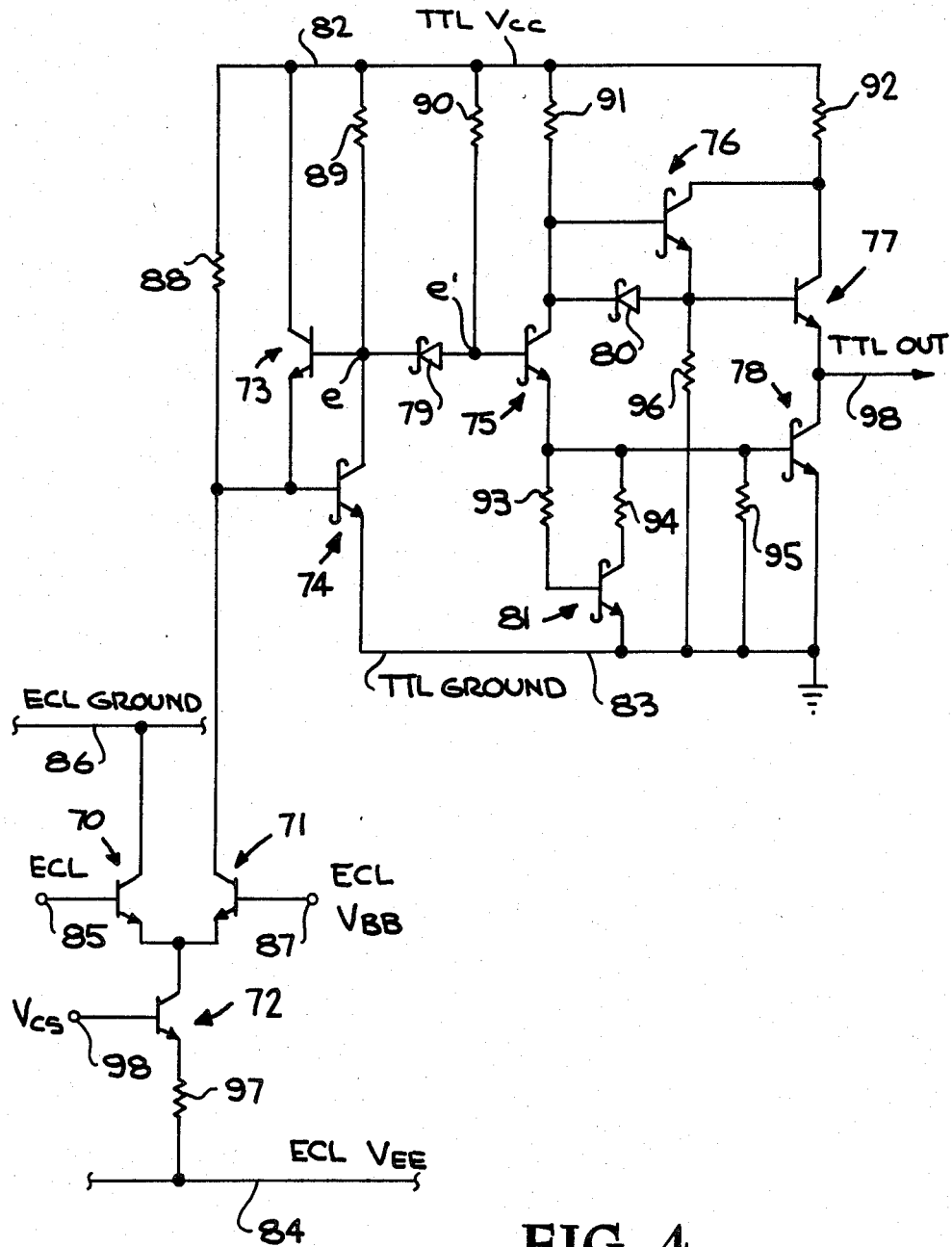
FIG. 4 is a circuit schematic of an ECL to TTL translator incorporated in an embodiment of the integrated circuit device of FIG. 2.

An ECL to TTL translator is shown in FIG. 4. This translator is suitable for use in ECL to TTL block 18 within the integrated circuit device 10 of FIG. 2 or in blocks 107, 108 and 116 of FIG. 5. Simpler circuits may be designed, but the differential circuit of FIG. 4 will not degrade the overall performance of integrated circuit device 10 since it has a fast response time. As far as an end user is concerned, the performance of integrated circuit device 10 will meet ECL standards and yet may be mixed and matched with devices designed with different logic families. The operation of the translator of FIG. 4 is described below in terms of ECL inputs signifying a logic 1 and signifying a logic 0.

ECL Input of $-0.8$ Volts-Logic 1

Since complementary levels are typically available on ECL gate circuits, the ECL to TTL translator circuit of FIG. 4 may be operated in several ways. One method of operation would be to apply the non-inverting ECL level on input 85 and the inverting level on input terminal 87. This would produce a clearcut swing on the differential pair 70, 71 as the logic levels changed. Alternatively, one or the other of the complementary logic levels may be supplied on input terminal 85 to transistor 70 with the ECL standard reference voltage $V_{BB}$ being supplied on input terminal 87 on the base of transistor 71. This will also produce a swing on the differential pair 70, 71 as the ECL logic swings. The following discussion is of the operation when a non-inverting input is supplied on the terminal 85. The terminal 87 on the base of transistor 71 is held at the ECL $V_{BB}$ reference, $-1.2$ volts. See, e.g., W. C. Seelbach, "Emitter-Coupled Logic", in *Integrated Circuits Applications Handbook*, p. 63 (1983). Thus, with a voltage of $-0.8$ volts impressed on terminal 85 the voltage on the base of transistor 70 will be greater than the voltage on the base of transistor 71. Transistor 70 will turn on and transistor 71 will turn off since the emitters of the two transistors are interconnected. The constant current through transistor 72 and resistor 97 will thus pass through transistor 70 to the ECL ground line 86. The value of the current will be controlled by the bandgap reference voltage $V_{CS}$ impressed on the base terminal 98 of transistor 72. Since transistor 71 is turned off, there is no contribution through transistor 71 to the current in transistor 88. The base of Schottky transistor 74 is at a potential of approximately 0.7 volts. Thus, Schottky transistor 74 is turned on. The current through transistor 74 and resistor 89 between TTL $V_{CC}$ line 82 and TTL ground line 83 will lower the potential at node e on the base of transistor 73. The potential which resides on the base of transistor 73 will be 0.3 volts, the saturation voltage $V_{SAT}$. Consequently, the potential at e' on the base of Schottky transistor 75 is $V_{SAT}$ plus the diode drop across Schottky diode 79. Thus, Schottky transistors 75 and 78 are both off because the voltage on the base of transistor 75 is not high enough to turn it on. Since there is no current through Schottky transistor 75, the base of Schottky transistor 76 goes to the level of TTL $V_{CC}$ so that transistor 76 turns on. The current flowing through resistor 92, Schottky transitor 76 and resistor 96 produces a potential on the base of transistor 77 which turns it on. Thus, the emitter output of transistor 77 is at two base-to-emitter voltages less than $V_{CC}$. This will be at least 3 volts so that a logic 1 is indicated on TTL output line 98.

ECL Input of −1.6 Volts-Logic 0

When a voltage of −1.6 volts is impressed upon the terminal 85 on the base of transistor 70, it will occur that the fixed voltage of −1.2 volts on the terminal 87 will be greater. Consequently, transistor 71 turns on and transistor 70 turns off. Current now flows through resistor 97, transistor 72, transistor 71 and resistor 88 between ECL $V_{EE}$ line 84 and TTL $V_{CC}$ line 82. The values of resistors 97 and 88 are selected such that when transistor 71 is turned on, sufficient current flows so that the voltage on the base of transistor 74 would be below the TTL ground level if transistor 73 were not in the circuit. Transistor 73 serves to prevent the voltage on the base of transistor 74 from going to the ground level. When the voltage on the base of transistor 74 approaches ground, the base-to-emitter voltage across Schottky transistor 74 is very small and transistor 74 is off. Consequently, there is no voltage drop across resistors 89 and 90 and the potentials at nodes e and e' rise. Since Schottky transistor 74 is turned off, the voltage on the base of Schottky transistor 75 rises to two base-to-emitter voltage drops (the drops across Schottky transistors 75 and 78). As a consequence, Schottky transistors 75 and 78 are turned on. Since Schottky transistor 78 is conducting in a saturation mode, the TTL output line 98 is pulled down low. Its voltage will be less than 0.8 volt and will signify a logic 0.

The internal translator scheme in accordance with the present invention may be incorporated in embodiments with internal logic of several logic families or with mixed logic and memory circuits of several families. For example, it may be desirable to have the logic configured in one logic family such as ECL and to have the memory configured in another logic family such as TTL. It is possible to mix both bipolar logic families such as TTL, ECL or I²L with MOS families such as CMOS and MOS. By adding a number of process steps both bipolar and MOS devices can be produced on the same chip. An embodiment of the present invention incorporating mixed logic families on-chip is shown in FIG. 5. ECL internal logic 115 and TTL internal logic 114 are fabricated on the same integrated circuit device 105. Inputs at the ECL logic level are provided on line 100 to pin $P_1$. The ECL logic levels are provided directly through the ECL input port 106 directly to ECL internal logic 115. The ECL level logic is translated in ECL to TTL translator 108 and supplied to TTL internal logic 114. The TTL input logic is supplied on line 101 to pin $P_i$. The TTL inputs are supplied directly through TTL input port 112 to TTL internal logic 114. The TTL level logic is translated in TTL to ECL translator 110 and supplied to ECL internal logic 115. The ECL to TTL translator 108 may be fabricated in accordance with the embodiment of FIG. 3 and the TTL to ECL translator 110 may be fabricated in accordance with the circuit of FIG. 4. The ECL output from the ECL internal logic 115 is supplied directly through ECL output port 109 to ECL output pin $P_n$ and thence to ECL output line 103. As described with respect to the embodiment of FIG. 2, ECL output port 109 will include a buffer to drive the output impedance of at least 50 ohms on ECL output line 103. The ECL output from ECL internal logic 115 is also supplied to ECL to TTL translator 107 and thence to TTL output pin $P_j$ and TTL output line 102. The output from TTL internal logic 114 is supplied directly through TTL output port 111 to TTL output pin $P_j$ and thence to TTL output line 102. Finally, the TTL output from TTL internal logic 114 is supplied to TTL to ECL translator 113 and thence to ECL output pin $P_n$ and ECL output line 103. Since the input ports 106 and 112, the output ports 109 and 111 and the translators 107, 108, 110 and 113 together add only about 10% to the die size, it is also feasible to add crosstalk translators so that the ECL internal logic 115 and the TTL internal logic 114 can communicate during processing. Thus, TTL to ECL translator 117 is provided to send TTL outputs to ECL internal logic 115 and ECL to TTL translator 116 is provided to communicate ECL outputs to TTL internal logic 114.

The mixing of logic families as shown in FIG. 5 is possible for any combination of logic families providing sufficient translators are provided on-chip. Tradeoffs in processing must be made between the optimization of one logic family and another in accordance with known processing techniques. Thus, for example, I²L may be mixed with ECL, MOS with TTL, ECL with CMOS, etc.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. In a semiconductor chip, an integrated circuit device comprising:

(a) means for accepting the input of first signals at the level of a first logic family to produce second signals at the level of said first logic family;

(b) means for accepting the input of third signals at the level of a second logic family to produce fourth signals at the level of said first logic family;

(c) circuit means, operative at the level of said first logic family for operating upon said second signals and said fourth signals to produce fifth signals and sixth signals, respectively, at the level of said first logic family;

(d) means for providing an output of seventh signals at the level of said first logic family in response to said fifth signals; and (e) means for providing an output of eighth signals at the level of said second logic family in response to said sixth signals.

2. An integrated circuit device, according to claim 1, wherein said means for accepting the input of third signals comprises means for translating the level of said third signals from the level of said second logic family to the level of said first logic family.

3. An integrated circuit device, according to claim 2, wherein said means for accepting the input of said first signals comprises means for directly coupling said first signals to said circuit means at the level of said first logic family.

4. An integrated circuit device, according to claim 2, wherein said means for accepting the input of said first signals comprises buffer means for receiving said first signals and producing said second signals for said circuit means.

5. An integrated circuit device, according to claim 1, wherein said means for providing an output of eighth signals comprises means for translating said sixth signals from the level of said first logic family to the level of said second logic family.

6. An integrated circuit device, according to claim 5, wherein said means for providing an output of seventh signals includes buffer means for receiving said fifth signals from said circuit means and providing an output external to the chip.

7. An integrated circuit device in accordance with any one of claims 1-6 wherein said first logic family is emitter coupled logic and said second logic family is transistor-transistor logic.

8. An integrated circuit device, in accordance with claim 1, wherein said circuit means comprises logic circuit means.

9. An integrated circuit device, in accordance with claim 1, wherein said circuit means comprises memory circuit means.

10. An integrated circuit device, in accordance with claim 1, wherein said circuit means comprises logic means and memory means.

11. An integrated circuit device in accordance with claim 1 wherein said means for providing an output of eighth signals at the level of said second logic family is a TTL to ECL translator comprising:

a constant current source transistor having its emitter connected to TTL ground;

a first pair of bipolar transistors having their emitters connected in common to the collector of said constant current source transistor, their collectors for connection to the power supply level TTL $V_{CC}$, the base of one transistor having a fixed reference voltage applied thereto and the base of the other transistor being applied to the TTL input line, so that said pair of bipolar transistors conduct differentially as the TTL input level is above or below said fixed reference voltage;

a second pair of bipolar transistors having their bases connected to the collectors of respective ones of said first pair of bipolar transistors, having their collectors connected to TTL $V_{CC}$ and having their emitters connected through respective resistor to the ECL $V_{EE}$ line;

a second constant current source transistor having its emitter connected to said ECL $V_{EE}$ line;

a third pair of bipolar transistors having their emitters connected in common to the collector of said second constant current source transistor, their collectors for connection to the power supply level ECL ground, and having their bases connected, respectively, to the emitters of respective ones of said second pair of bipolar transistors; and a pair of output transistors having their bases connected to respective ones of the collectors of said third pair of bipolar transistors, their collectors connected in common to ECL ground and their emitters connected through current stabilizing means to ECL $V_{EE}$, the emitters of said pair of output transistors serving as the inverting and non-inverting ECL outputs.

12. An integrated circuit device in accordance with claim 1 wherein said means for accepting the input of third signals at the level of a second logic family to produce fourth signals at the level of said first logic family comprises an ECL to TTL translator, including a constant current source transistor having its emitter connected to the ECL $V_{EE}$ reference level and its base connected to a bandgap reference voltage;

a pair of bipolar transistors having their emitters connected in common to the collector of said constant current source transistor and having their collectors connected, respectively, to ECL ground and to a differential drive circuit, said differential drive circuit comprising a pullup output transistor having its emitter connected to the TTL output line and its collector connected to TTL $V_{CC}$;

a pulldown output transistor having its collector connected to the TTL output line and its emitter connected to TTL ground;

a first base drive transistor having its emitter connected to the base of said pullup output transistor and having its collector connected to the collector of said pullup output transistor;

a second base drive transistor having its emtter connected to the base of said pulldown output transistor and having its collector connected to TTL $V_{CC}$ through a resistor, to the base of said first base drive transistor and to the base of said pullup output transistor through a diode; and means in response to current from said constant current source conducted through the one of said pair of bipolar transistors connected to said differential drive circuit to turn said first base drive transistor on or off, and thereby turn said second base drive transistor off or on to either pull up or pull down said TTL output level in accordance with an ECL input level applied to the base of at least one of said pair of bipolar transistors.

\* \* \* \* \*